United States Patent
Inoke et al.

(10) Patent No.: US 6,906,255 B2
(45) Date of Patent: Jun. 14, 2005

(54) GASKET AND ELECTRONIC APPARATUS HAVING THE SAME

(75) Inventors: Misao Inoke, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/722,121

(22) Filed: Nov. 26, 2003

(65) Prior Publication Data

US 2004/0149473 A1 Aug. 5, 2004

(30) Foreign Application Priority Data

Dec. 19, 2002 (JP) ........................................ 2002-367762

(51) Int. Cl.[7] .............................................. H05K 9/00
(52) U.S. Cl. ............................................... 174/35 GC
(58) Field of Search ......................... 174/35 R, 35 GC; 361/816, 818; 277/920

(56) References Cited

U.S. PATENT DOCUMENTS

| 5,001,297 | A | * | 3/1991 | Peregrim et al. | ...... | 174/35 GC |
| 5,313,016 | A | * | 5/1994 | Brusati et al. | ......... | 174/35 GC |
| 5,532,428 | A | * | 7/1996 | Radloff et al. | ......... | 174/35 GC |
| 5,569,877 | A | * | 10/1996 | Yumi | ..................... | 174/35 GC |
| 6,218,611 | B1 | * | 4/2001 | Bias | ....................... | 174/35 GC |
| 6,225,555 | B1 | * | 5/2001 | Sosnowski | ............. | 174/35 GC |
| 6,320,120 | B1 | * | 11/2001 | Van Haaster | .......... | 174/35 GC |

FOREIGN PATENT DOCUMENTS

JP         8-274485         10/1996

* cited by examiner

Primary Examiner—Hung V. Ngo
(74) Attorney, Agent, or Firm—Westerman, Hattori, Daniels & Adrian, LLP

(57) ABSTRACT

A gasket that serves to shield electromagnetic waves from an electronic apparatus that has a housing that includes a first surface and a second surface opposite to the first surface, the gasket being squeezed into a perforation hole that perforates the first and second surfaces, and fixed onto the housing includes a lid part that contacts the first surface and serves as a flat spring, and an insertion part that is to be inserted into the perforation hole in the housing, and includes an engagement part, coupled with the support part, which at least partially projects from the perforation hole in the housing and contacts the second surface, wherein the engagement part includes a leg coupled with the the support part, and a foot that is coupled with the leg and forms an acute angle relative to the leg.

13 Claims, 16 Drawing Sheets

(5 of 16 Drawing Sheet(s) Filed in Color)

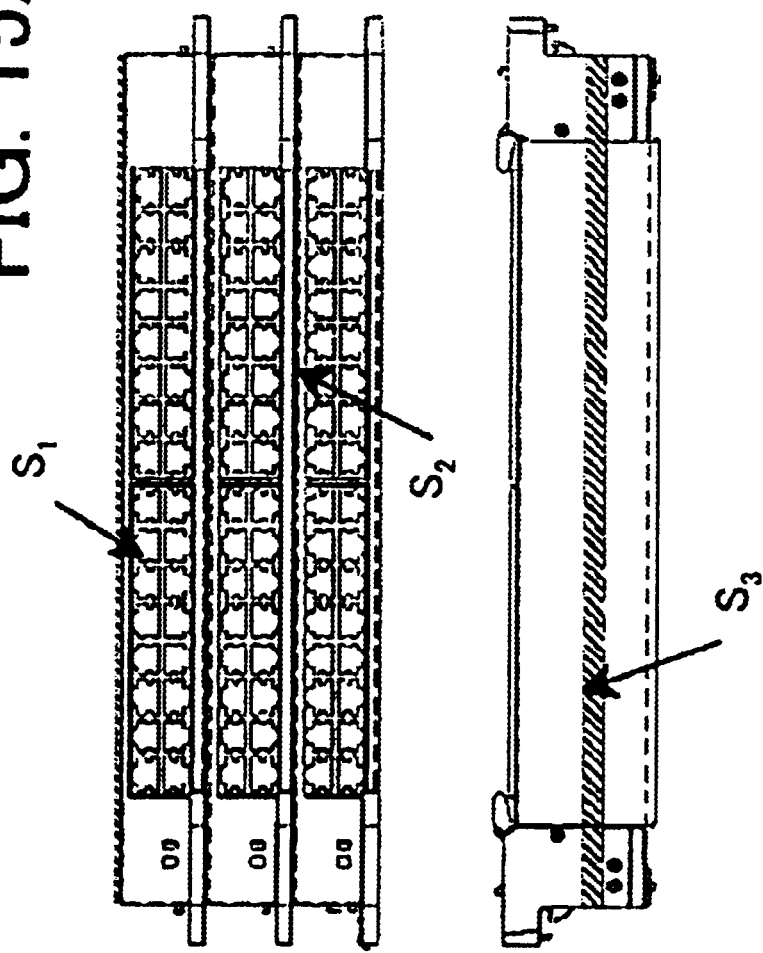
FIG. 15A
FIG. 15C
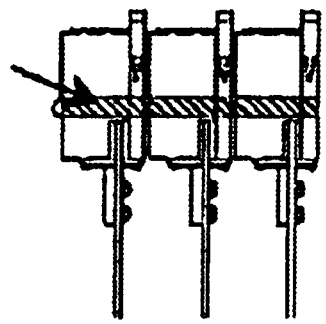
FIG. 15B

PRIOR ART

US 6,906,255 B2

GASKET AND ELECTRONIC APPARATUS HAVING THE SAME

This application claims a benefit of priority based on Japanese patent application No. 2002-367762, filed on Dec. 19, 2002, which is hereby incorporated by reference herein in its entirety as if fully set forth herein.

BACKGROUND OF THE INVENTION

Along with recent widespread electronic apparatuses, the supply high-performance electronic apparatuses have been increasingly demanded. For example, conventional computers and communication controllers as exemplary electronic apparatuses have used gaskets that can be mounted onto a housing for resistance to electromagnetic waves from a printed plate (as disclosed, for example, in Japanese Patent Publication No. 8-274485). This gasket is required to have a physical structure to shield electromagnetic waves as well as a mechanical structure that facilitates mounting onto an electronic apparatus housing and prevents falling off from the housing.

A description will be given of a conventional gasket 10 with reference to FIGS. 20 and 21. Here, FIG. 20 is a perspective overview of the conventional gasket 10. As illustrated, the gasket includes a lid part 20 and an insertion part 30. Due to the lid part 20 and insertion part 30, the gasket 10 forms an approximately π shaped section. The insertion part 30 is a portion to be inserted into a housing, and includes a pair of support parts 32 each having an approximately rectangular parallelepiped shape, and a pair of engagement parts 34 each having an approximately right triangle pole shape.

FIG. 21 is a sectional view before and after the gasket 10 is inserted into a computer housing 2. The housing 2 has a perforation hole 4. Each support part 32 is slightly longer than the perforation hole 4 in the housing 2. The gasket 10 is made of an elastic member, and thus a pair of support parts 32 and engagement parts 34 deform so that they approach to each other while the gasket 10 is being inserted into the housing 2, and return so that they separate from each other after the engagement parts 34 project from the perforation hole 4.

As shown in FIG. 21, when the gasket 10 is inserted into the housing 2, the lid part 20 contacts a top surface 6 of the housing 2, the support parts 32 of the insertion part 30 are located in the perforation hole 4, and the engagement parts 34 project from a bottom surface 8 of the housing 2, so that bracket parts 35 contact the peripheral of the perforation hole 4. When the engagement parts 34 contact the bottom surface 8, the lid part 20 applies an elastic force as a flat spring to the housing 2.

Thus, the conventional gasket 10 is configured so that once it is inserted into the housing 2, the bracket parts 35 of the engagement parts 34 are hooked on the bottom surface of the housing 2 even when it is attempted to be pulled out and it does not come off easily.

FIG. 22 is a graph of exemplary reactions in mounting the gasket 10 onto and pulling off the gasket 10 from the housing 2. FIG. 22 shows results of two experiments F1RF2 and F2RF2. As illustrated, it is understood that the mounting reaction is 360 g (180 g ×2) per width, and the puling-off reaction is 140 g (70 g ×2) per width. This means that the pulling-off force is smaller than the mounting force and the gasket 10 is easily pulled off. In other words, the conventional gasket 10 has not had such a structure as meets a mechanical requirement of easy mounting and hard pulling off. When the gasket 10 comes off electromagnetic waves and noises leak from a printed circuit board in an electromatic apparatus, undesirably causing, for example, a t levision around the electronic apparatus to distort screen images. In addition, the coming-off gasket 10 also causes a problem of a loss due to its small size. Therefore, it is preferable that the pulling force is larger than the mounting force and the mounting force is as small as possible.

BRIEF SUMMARY OF THE INVENTION

Accordingly, it is an exemplary object of the present invention to provide a gasket that is structurally easily mounted onto and hard to come off from an electronic apparatus, and the electronic apparatus having the gasket.

In order to achieve these and other objects, a gasket of one aspect according to the present invention that serves to shield electromagnetic waves from an electronic apparatus that has a housing that includes a first surface and a second surface opposite to the first surface, the gasket being squeezed into a perforation hole that perforates the first and second surfaces, and fixed onto the housing includes a lid part that contacts the first surface and serves as a flat spring, and an insertion part that is to be inserted into the perforation hole in the housing, wherein the insertion part includes a support part that extends from an approximate center of the lid part and is accommodated into the perforation hole, and an engagement part, coupled with the support part, which at least partially projects from the perforation hole in the housing and contacts the second surface, wherein the engagement part includes a leg coupled with the support part, and a foot that is coupled with the leg and forms an acute angle relative to the leg. A gasket as another aspect according to the present invention that serves to shield electromagnetic waves from an electronic apparatus that has a housing that includes a first surface and a second surface opposite to the first surface, the gasket being squeezed into a perforation hole that perforates the first and second surfaces, and fixed onto the housing includes a lid part that contacts the first surface and serves as a flat spring, and an insertion part that is to be inserted into the perforation hole in the housing, and includes an engagement part, coupled with the support part, which at least partially projects from the perforation hole in the housing and contacts the second surface, wherein the engagement part includes a leg coupled with the support part, and a foot that is coupled with the leg and forms an acute angle relative to the leg.

The foot may have a tip that is to contact the second surface. The leg may diverge from an approximate center of the support part. The engagement part may have a projection that prevents the gasket from coming off and projects from the foot. The foot may have a tip that can contact the second surface, and has an acute shape in sectional that prevents coming off of the gasket. The support part may have a projection opposite to the perforation hole. The engagement part may have an anchor shape. The leg may extend from the support part and forms an acute angle relative to the support part.

A gasket as another aspect according to the present invention that serves to shield electromagnetic waves from an electronic apparatus that has a housing that includes a first surface and a second surface opposite to the first surface, the gasket being squeezed into a perforation hole that perforates the first and second surfaces, and fixed onto the housing includes a lid part that contacts the first surface and serves as a flat spring, and an insertion part that is to be inserted into the perforation hole in the housing, and includes an engagement part, coupled with the support part, which at least partially projects from the perforation hole in the housing and contacts the second surface, wherein the engagement part includes a pair of projections that extend in opposite directions, which do not contact each other while the gasket is being inserted into the housing, and contact each other while the gasket is being pulled off from the housing.

The instant inventors have experimentally confirmed that a gasket having any one of the above structures is easily mounted onto and hard to come off from an electronic apparatus. An electronic apparatus having any one of thes gask ts constitute one aspect of the present invention.

Other objects and further features of the present invention will become readily apparent from the following description of the embodiments with reference to accompanying drawings.

BRIEF DESCRIPTION OF THE DRAWINGS

This patent application file contains a series of drawings executed in color. Copies of this patent or patent application publication with color drawings will be provided by the Office upon request and payment of the necessary fee.

FIG. 15 is a view for explaining a shield structure of the network device shown in FIG. 11.

DETAILED DESCRIPTION OF THE INVENTION

The instant inventors have conducted simulations about mounting and pulling-off forces while partially improving a structure of the conventional gasket 10. A description will now be given of modified structures and their effects.

Figure 16:
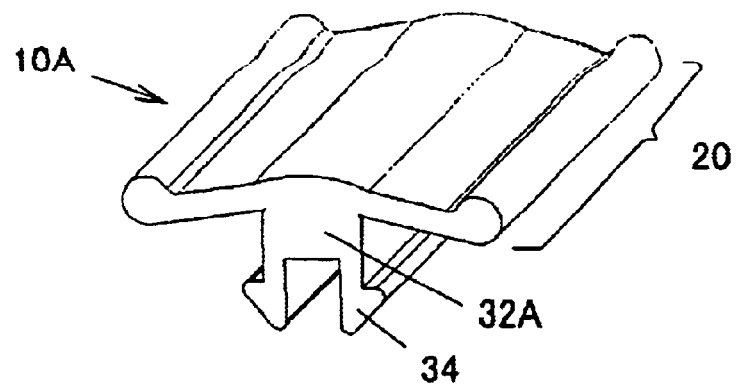
FIG. 16 is a perspective overview of an improvement of a conventional gasket.

The instant inventors initially reviewed an increase of a pulling-off force by enlarging rigidity of the insertion part 30. Accordingly, a gasket 10A shown in FIG. 16 is produced which fills between the pair of support parts 32 to form a single member, and its reaction was simulated. The gasket 10A shown in FIG. 16 is similar to the gasket 10A. When the gasket 10A is inserted into the perforation hole 4, the bracket parts 35 of the engagement part 34 crush due to plastic deformation, but mounting and pulling-off reactions increase.

Figure 17:
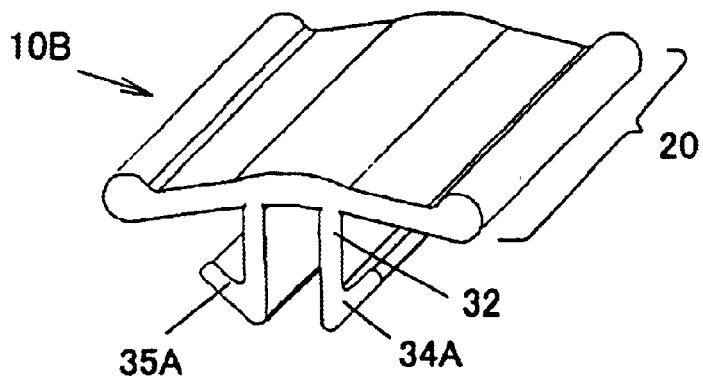
FIG. 17 is a perspective overview of an improvement of the conventional gasket.
Figure 20:
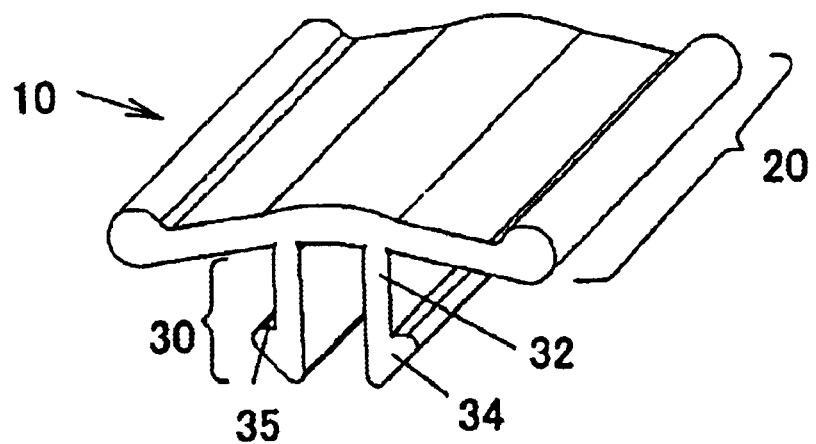
FIG. 20 is a perspective overview of the conventional gasket.
Figure 21:
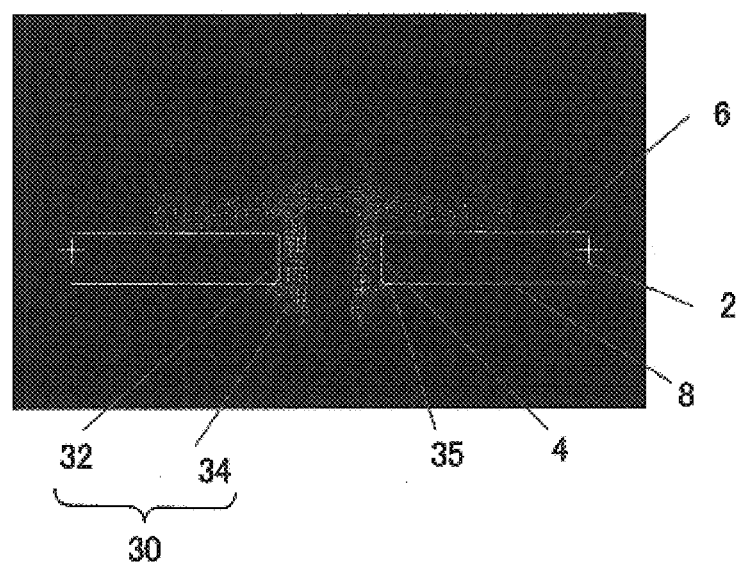
FIG. 21 is a sectional view before and after the gasket shown in FIG. 20 is inserted into a computer housing.

Next, the instant inventors have reviewed an extension of a length of the bracket part 35 of each engagement part 34 shown in FIG. 20 in order to increase the contact area with the bottom surface 8 and enhance consequently the puling-out force. Since the mounting reaction increases when the bracket part 35 extends in a direction perpendicular to the support part 32 as shown in FIG. 20, a gasket 10B was prepared and its reaction was simulated. The gasket 10B includes a pair of engagement parts 34A each having a bracket part 35A that extends and forms an acute angle relative to the support part 32. The gasket 10B shown in FIG. 17 is similar to the gasket 10 except that it has the bracket parts 35A. Here, FIG. 17 is a perspective overview of the gasket 10B. It was found that when the gasket 10B was inserted into the perforation hole 4, the bracket parts 35A of the engagement parts 34A sufficiently deformed, thereby decreasing the mounting reaction and increasing the pulling-off reaction.

Figure 18:
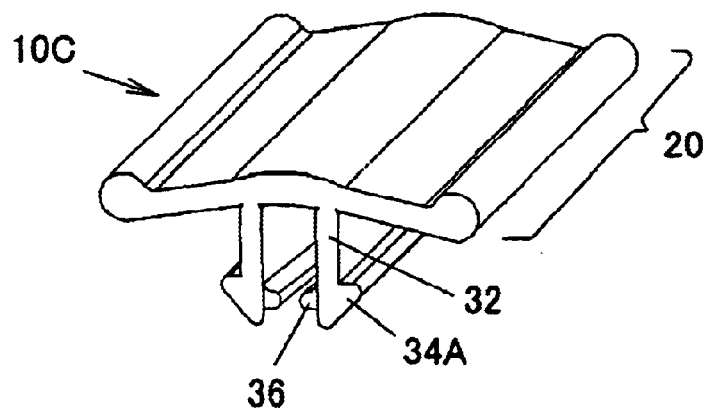
FIG. 18 is a perspective overview of another improvement of the conventional gasket.

Next, the instant inventors have reviewed a pulling-off prevention by a pair of engagement parts 34 that approach to each other mounted onto the housing 2. Accordingly, a gasket 10C was prepared and its reaction was simulated. The gasket 10C includes the engagement parts 34 shown in FIG. 20 that have projections 36 inside the engagement parts 34. The gasket 10C shown in FIG. 18 is similar to the gasket 10 except that it has the projections 36. Here, FIG. 18 is a perspective overview of the gasket 10C. It was found that when the gasket 10C was inserted into the perforation hole 4, the projections 36 of the engagement parts 34 crushed due to plastic deformation, but increased the inserting and pulling-off reactions.

Figure 19:
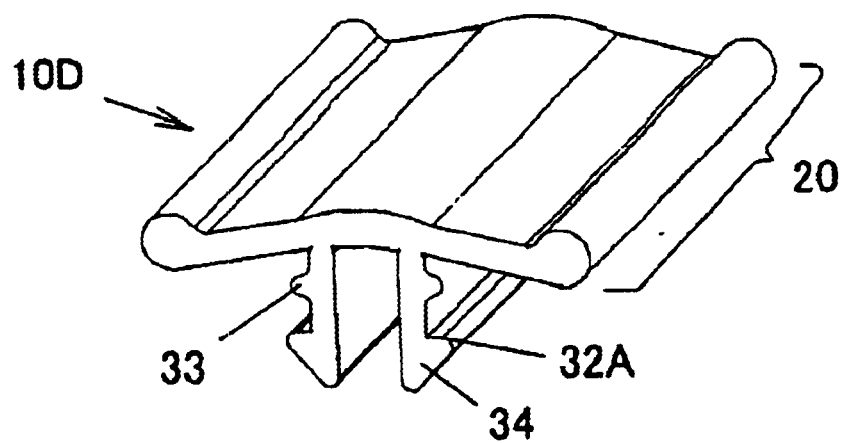
FIG. 19 is a perspective overview of another improvement of the conventional gasket.

Next, the instant inventors have conducted a simulation by providing the support parts 32 shown in FIG. 20 with projections 33 opposite to the perforation hole 4. A gasket 10D shown in FIG. 19 is similar to the gasket 10 except that it has the projections 33. Here, FIG. 19 is a perspective overview of the gasket 10D. It was found that the gasket 10D showed the decreased mounting reaction and the increased pulling-off reaction.

Figure 1:
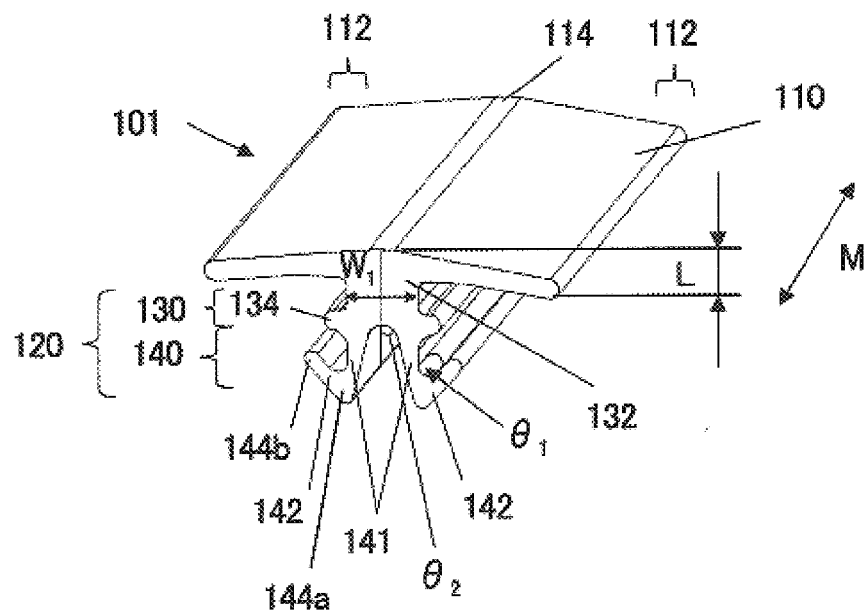
FIG. 1 is a perspective overview showing a gasket body as one embodiment according to the present invention.
Figure 2:
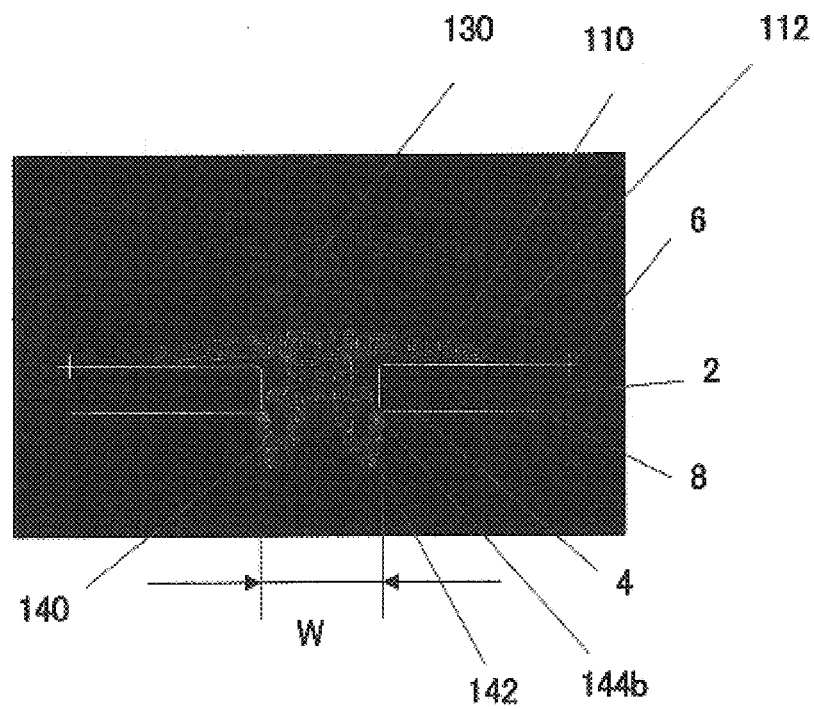
FIG. 2 is a sectional view before and after the gasket body shown in FIG. 1 is inserted into a housing of an electronic apparatus.

A description will be given of a gasket 100 as one embodiment according to the present invention with reference to the accompanying drawings. The gasket 100 has been prepared considering the results of the above simulations. Here, FIG. 1 is a perspective overview showing a gasket body 101. FIG. 2 is a sectional view before and after the gasket body 101 is inserted into the computer housing 2. In the following description, reference numerals with capitals are variations of members assigned reference numerals without alphabets, and generalized by reference numerals without alphabets unless otherwise specified.

Figure 9:
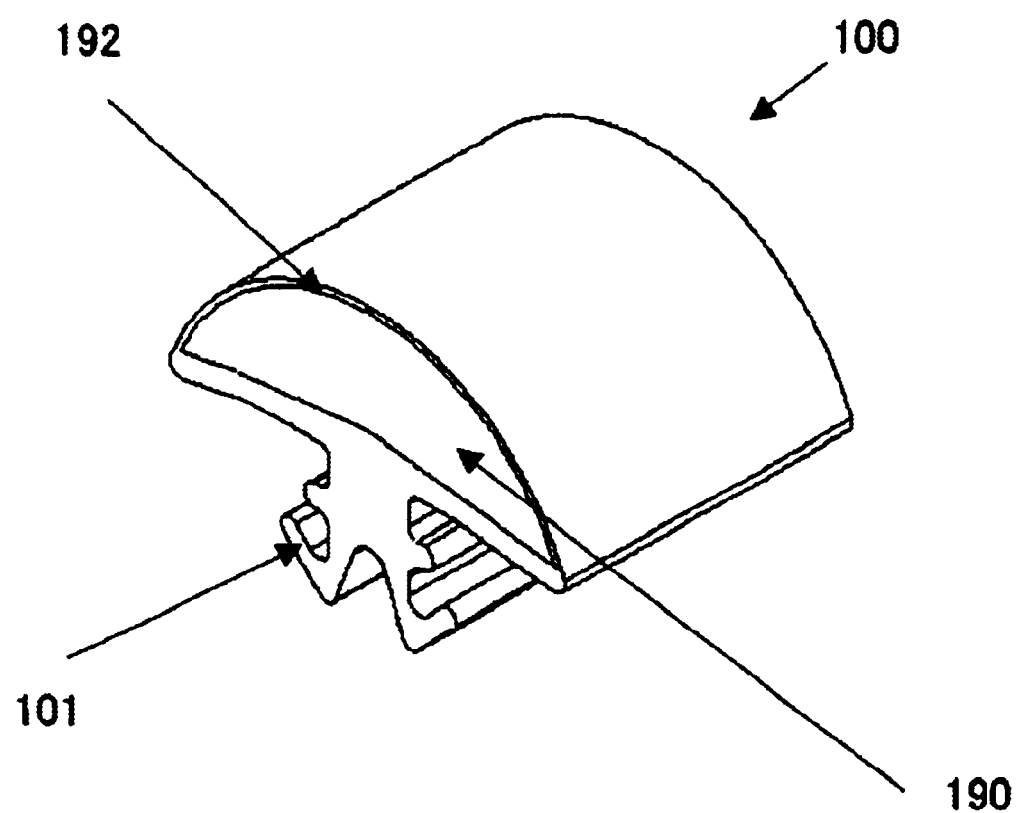
FIG. 9 is a perspective overview of a gasket as one embodiment according to the present invention that has the gasket body shown in FIG. 1.

The gasket 100 includes, as shown in FIG. 9, a gasket body 101 made of an elastic material, such as silicon rubber, a cotton 190 that has an approximately semicircle section and covers the gasket body 101, and (electrically) conductive cloth 192. The conductive cloth 192 serves to shield electromagnetic waves, and the cotton 190 provides the conductive cloth 192 with elasticity and prevents damages of the conductive cloth 192. Since the cotton 190 and conductive cloth 192 may apply any material, manufacture and attachment known in the art of the gasket, a detailed description thereof will be omitted.

The gasket body 101 includes, as shown in FIG. 1, a lid part 110 and an insertion part 120, and is made of an elastic material, such as silicon rubber, similar to the gasket 20. The basket body 101 forms an approximately π shape due to the lid part 110 and the insertion part 120.

The lid part 110 contacts the surface 6 of the housing 2 and serves as a flat spring. The lid part 110 has an approximately V-shaped section that extends in a direction M in FIG. 1, and contacts the surface 6 of the housing 2 through a pair of ends 112. The ends 112 are chamfered or formed like a curve, and the shape differs from the nodule lid part 20. However, the lid part 110 has substantially the same function as the lid part 20. Therefore, the ends 112 of the lid part 110 may have a shape similar to or different from the lid part 20. The elastic force of the flat spring is adjustable by adjusting a distance L between a tip of the center part of the lid part 110 and part of the end 112 that contacts the surface 6. Due to the flat spring function, the lid part 110 is deformable when the center edge line 114 is pressed after inserted into the housing 2. The cotton 190 and the conductive cloth 192 are attached to the top surface of the lid part 110.

The insertion part 120 is a portion that is inserted into the perforation hole 4 in the housing 2, as shown in FIGS. 1 and 2, and includes a support part 130 and a pair of engagement parts 140.

The support part 130 extends from an approximate center of the lid part 110 and is accommodated in the perforation hole 4. The support part 130 includes a base 132, and a pair of projections 134, provided on the base 132, which face the perforation hole 4.

The support part 130 of the instant embodiment is a single member, different from the pair of support parts 32 of the gasket 10 shown in FIG. 20. In other words, it has the base 132 that has an approximately rectangular parallelepiped shape that fills the inside space in the pair of support parts 32. This is because the pulling-off reaction increases from the simulation result of the gasket 10A shown in FIG. 16. A width $W_1$ of the base 132 of the instant embodiment is set, for example, 40% to 60% of the width W of the perforation hole 4.

A pair of projections 134 project from the support parts 130 toward an inner surface of the perforation hole 4, contact the inner surface of the perforation hole 4 when the gasket 100 is pulled off, increasing the resistance and pulling-off reaction. The projection 134 is set, for example, to be about 20% to 30% of the width of the perforation hole in the instant embodiment. The width $W_1$ of the base 132 may be increased instead of providing the base 132 with projections 134, although the width W must be increased within a range that does not cause the plastic deformation of the engagement part 140.

Figure 4:
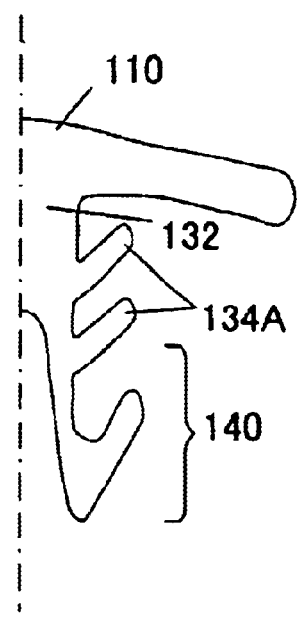
FIG. 4 is a partial sectional view showing a variation of a projection of a support part in the gasket body shown in FIG. 1.

Each projection 134 of the instant embodiment exemplarily has an approximately semicircular shape. However, they may extend in an upper oblique direction in order to increase the reaction in pulling off the gasket 100. The number of projections 134 is not limited to one. FIG. 4 shows an enlarged side view of two projections 134A at one side of two pairs of projections 134A that extend from the base 132 in upper oblique directions. The upper and lower projections 134A may have different shapes and lengths. The upper oblique extension enables the projections 134A to deform while assisting in an insertion, and apply resistance to the inner surface of th perforation hole 4 so as to prevent pulling off. A tip of the projections 134A may be enlarged in order to enhance the resistance with the inner surface of the perforation hole 4 at the time of pulling off.

The engagement parts 140 diverge like an approximately V shape from an approximate center of the support part 130. They partially project from the perforation hole 4 in the housing 2 and contact the bottom surface 8 of the housing 2, as shown in FIG. 2.

Each of a pair of engagement parts 140 includes a leg 141 coupled with the base 132 of the support part 130, and a foot 142 arranged to form an acute angle relative to the leg 141.

In the instant embodiment, the leg 141 diverges into two from an approximate center of the base 132 of the support part 130 and has a divergence angle $\theta_2$ of an acute angle. As will be described with reference to FIG. 10, the present invention does not require the leg 141 from diverging from the support part 130 or the angle $\theta_2$ from the support part 130 to be an acute angle. The leg 141 is elastically deformable and serves to support the foot 142. The length if the leg 141 is set to be a length connectible to the bottom surface 8.

The foot 142 is arranged so that an angle $\theta_1$ is acute relative to the leg 141. This is because the simulation shown in FIG. 20 by the instant inventors shows that the engagement parts 140 easily plastically deform when they extend from the support part 32 perpendicularly, and the reaction in pulling off the gasket decreases when the angle $\theta_1$ is an obtuse angle. The foot 142 has a connection part 144a coupled with the leg 144a, and a tip 144b.

In the instant embodiment, the connection part 144a is a heel of the foot 142, but the present invention allows the leg 141 to be connected to the foot 142 at its center.

The tip 144b contacts the bottom surface 8 of the housing 2. The tips 144b must be located outside the projections 134, because when they are located inside the projections 134, they do not contact the inner surface of hole 4 or the bottom surface 8 and cannot serve as an engagement function.

Figure 5:
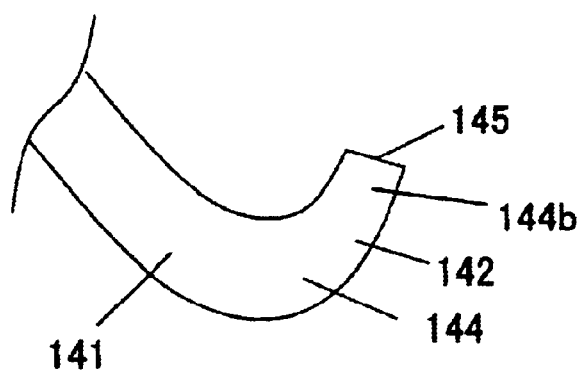
FIG. 5 is a partial sectional view showing a variation of an engagement part of the gasket body shown in FIG. 1.

When the tip 144b changes its shape from a circular section to an acute section, as shown in FIG. 5, the tip 144b preferably deforms so as to assist an insertion and applies the resistance to the bottom surface 8 so as to prevent pulling off. Here, FIG. 5 is an enlarged sectional view of a foot as a variation of the foot 142 shown in FIG. 1. If necessary, the resistance may be increased by roughing a surface of the cut end 145 and/or applying a sticky material. The cut end 145 must face the bottom surface 8, because the cut end 145 if facing opposite to the bottom surface 8 would cause increased reaction in mounting the gasket.

FIG. 2 is a sectional view before and after the gasket 100 is inserted into a computer housing 2. The engagement parts 140 have such a length that when the gasket 100 is inserted into the housing 2, the tip 144b of the engagement part 140 is located near a boundary between the perforation hole 4 and the inner surface 8.

In inserting the gasket 100 into the housing 2, a user sets the gasket 100 on the perforation hole 4, and squeezes it by pressing the lid part 110. If necessary, a pair of feet 142 are made narrower by a thumb and a forefinger in squeezing the gasket 100. Since the gasket 100 is made of an elastic member, the feet 142 bend after contacting the perforation hole 4, and deforms so that the pair of engagement parts 140 approach to each other, allowing the gasket 100 to be squeezed.

After the gasket 100 is inserted into the housing 2, the engagement parts 140 project from the perforation hole 4, and then return so as to be apart from each other. As shown in FIG. 2, the ends 112 of the lid part 110 contact the top surface 6 of the housing, the support part 130 of the insertion part 120 is located in the perforation hole 4, and the engagement part 140 is located so that the tips 144b are located near the boundary between the bottom surface 8 and the perforation hole 4. The lid part 110 may apply the elastic force as a flat spring to the housing 2 when the engagement part 140 contacts the bottom surface 8.

Thus, after the gasket 200 is inserted into the housing 2, the tips 144b of the feet 142 of the engagement part 140 are caught by the bottom surface 8 and the perforation hole 4 of the housing 2, whereby the gasket 100 does not structurally easily fall off from the housing 2 once it is mounted onto the housing 2.

Figure 3:
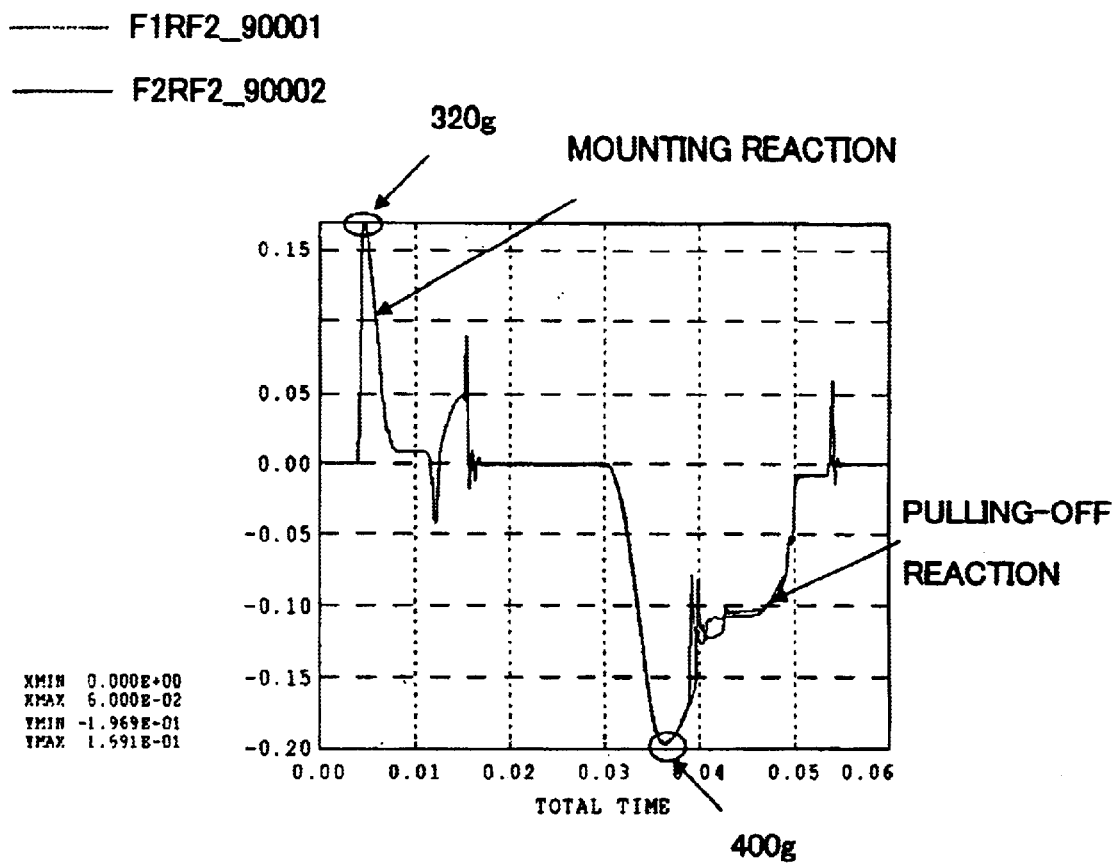
FIG. 3 is a graph showing reactions in mounting the gasket body shown in FIG. 1 onto and pulling off the same from the housing of the electronic apparatus.

FIG. 3 is a graph showing reactions in mounting the gasket body 101 onto and pulling off the same from the housing 2, showing a result of two experiments (F1RF2__900001 and F1RF2__90002). As illustrated, the mounting reaction was 320 g (160 g×2) per width, and the pulling-off reaction was 400 g (200 g×2) per width.

Figure 22:
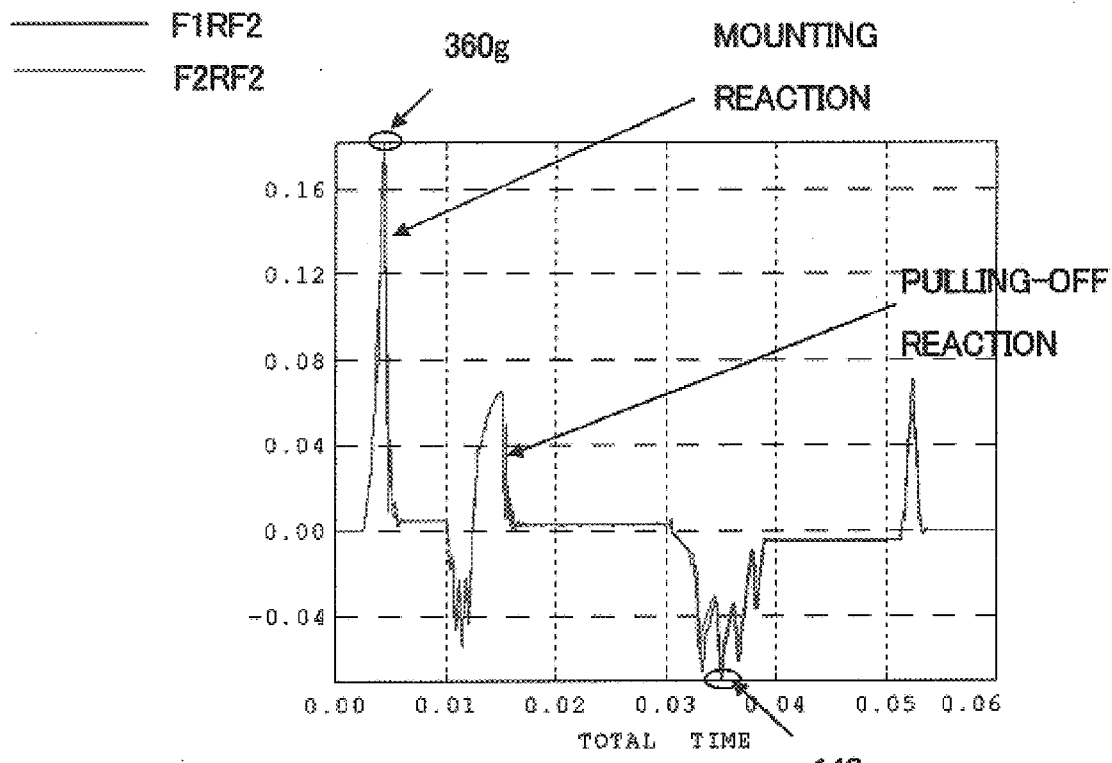
FIG. 22 is a graph showing exemplary reactions in mounting the gasket shown in FIG. 20 onto and pulling off the gasket from the housing.

In comparison with a result shown in FIG. 22, it is understood that the pulling-off force is greater than the mounting force, preventing easy coming off. In addition, the mounting force decreases from 360 g to 320 g while the pulling-off force increases from 140 g to 400 g. Therefore the gasket 100 is more easily mounted than the gasket 10 and enhances the coming-off prevention function. Thus, the gasket 100 meets the mechanical requirement of easy mounting an hard coming-off more satisfactorily than the conventional.

Figure 6:
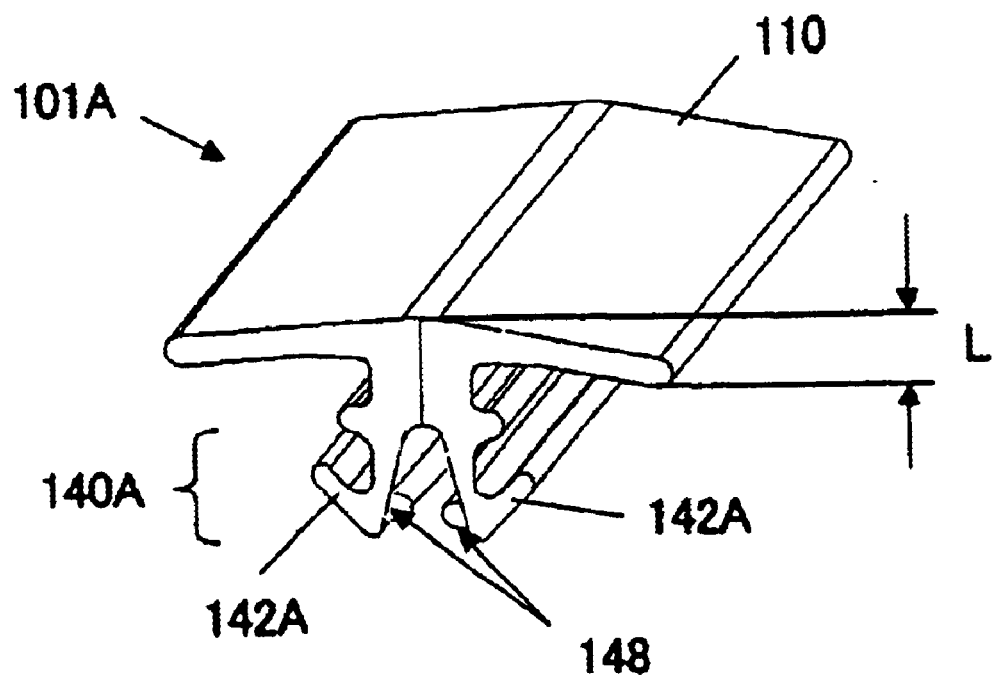
FIG. 6 is a partial sectional view showing a variation of the gasket body shown in FIG. 1.

FIG. 6 shows a gasket 101A as a variation of the gasket body 101. The basket body 101A has the engagement part 140A different from the engagement part 140, which includes projections 148 that face each other at a heel of each foot 142A.

Each projection 148 prevents the gasket body 101A from being pulled off as described with reference to FIG. 7, and protrudes from each foot 142A.

Figure 7A:
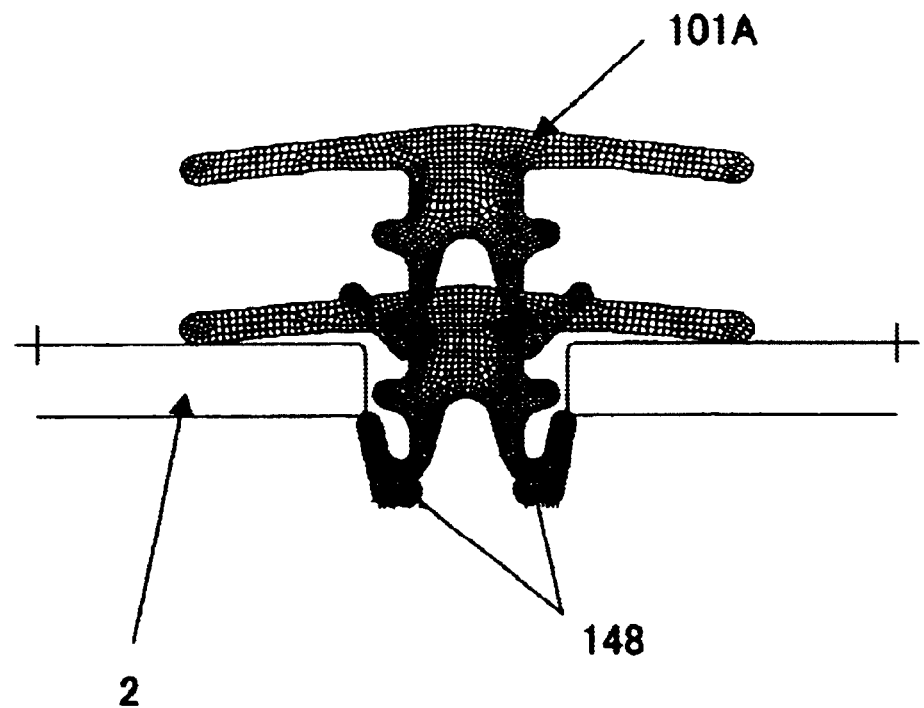
FIG. 7 is sectional views before and after the gasket body shown in FIG. 6 is inserted into the housing of an electronic apparatus.

FIG. 7A is a sectional view showing a state of the projection 148 before and after the gasket 100A is inserted into the housing 2. As illustrated, when the gasket body 101A is being inserted into the housing 2, pair of feet 142 bend toward the inside after contacting the perforation hole 4, and consequently deform so that heels separate from each other. Therefore, the projections 148 provided at the heels of the feet 142 deform so that they separate from each other, not hindering an insertion of the gasket 100A.

Figure 7B:
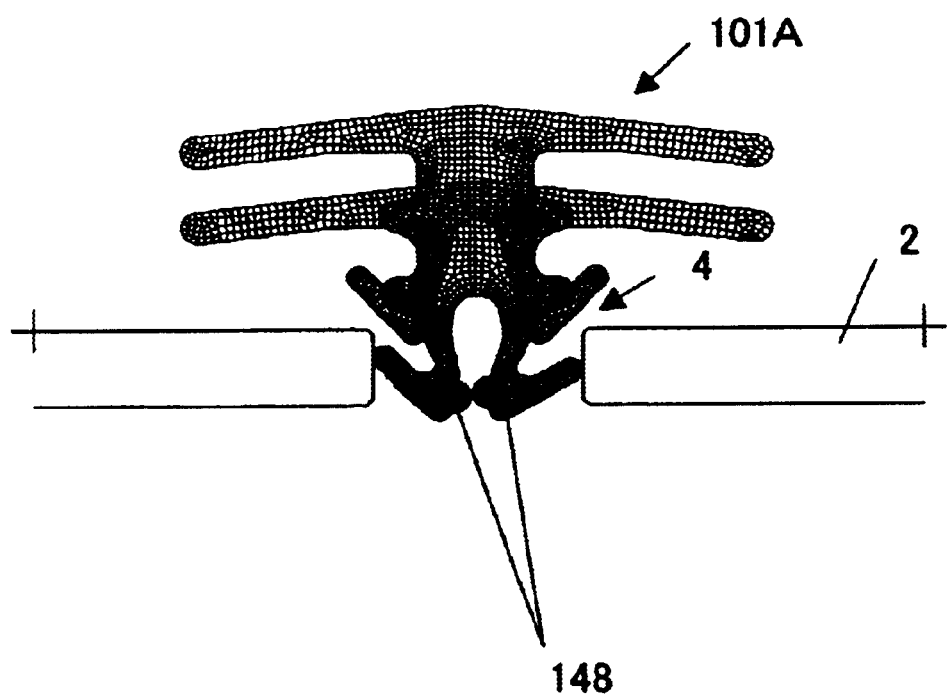

On the other hand, FIG. 7B is a sectional view showing a state of the projection when pulling off of the gasket body 101A starts and ends. The instant inventors have found that when the gasket 100A is inserted into the housing 2, the feet 142 do not open perfectly outside the perforation hole 4 in most cases, as shown in FIG. 7A, but the tips 144b are located near the boundary between the bottom surface 8 and the inner surface of the perforation hole 4. In addition, the instant inventors have found that when the gasket 100A i pulled off in that state, the tips 144b moves up while slipping along the inner surface of the perforation hole 4.

Therefore, in an attempt to pull off the gasket 100A from the housing when there are projections 148, as shown in FIG. 7B, the tips 144b are caught by the inner surface of the perforation hole 4 and deform to the outside, whereby the heels deform and approach to each other consequently. Therefore, the projections 148 provided at the heels of the feet 142 deform, approach to each other and contact finally. When the gasket 100A continues to be pulled off, the pulling-off force resists the elastic force after the projections 148 contact and the force necessary for the plastic deformation depending upon a size of the projection 148. Therefore, the projection 148 may increase the pulling-off force. According to the simulation by the instant inventors, the pulling-off force was about 800 g, an about sextuple increase.

The present invention do not limit a size and a shape of the projection 148, but the size and shape are preferably determined so that the projections 148 contact when the gasket body 101 is pulled off, because if the projections 148 do not contact each other when the gasket body 101A is pulled off, they do not contribute to an increase of the pulling-off force. However, it is optional whether the projections 140 plastically deform because the excessively large pulling-off force with a demand for exchange of a deteriorated gasket would make it difficult to exchange the gasket.

It is sufficient that the projections 148 act to prevent pulling off of the gasket 100, and the present invention covers the number of projections 148 of one and three or more.

Figure 8A:
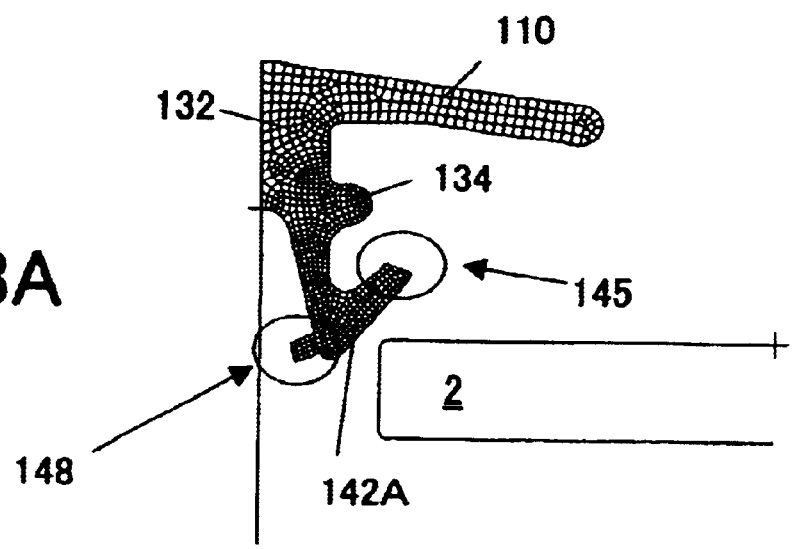
FIG. 8 is a partial sectional view showing a variation of a projection of a support part in the gasket body shown in FIG. 6.
Figure 8B:
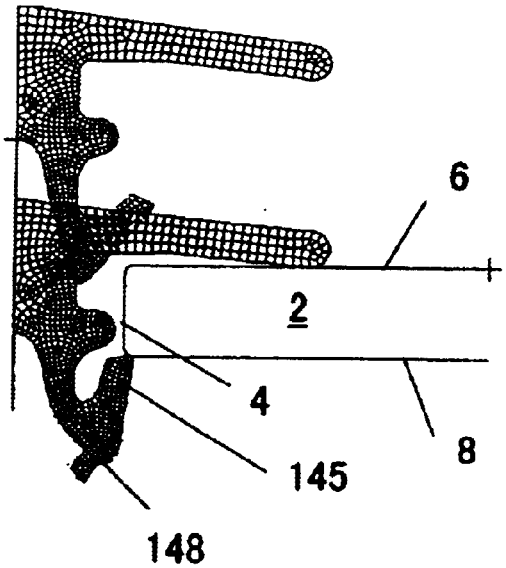
Figure 8C:
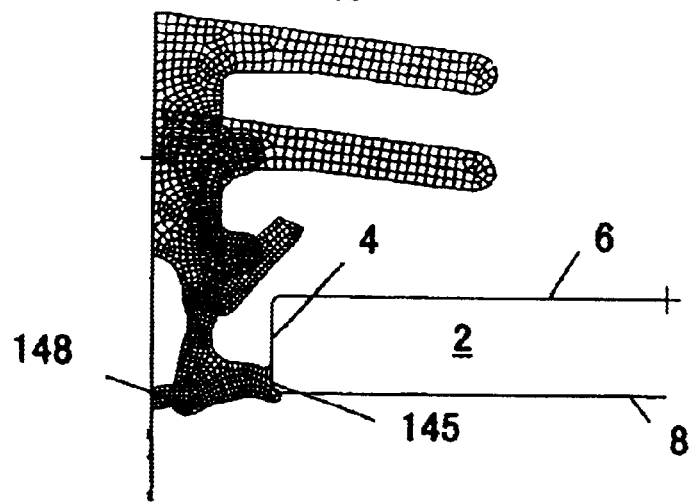

FIGS. 8A to 8C show an example that provides the gasket body 101A with the cut ends 145, similar to FIG. 5. FIG. 8A is a partial section showing the cut end 145 and the projection 148 before the gasket body 101A is inserted into the housing 2. FIG. 8B is a partial section showing the cut end 145 and the projection 148 before and after the gasket body 101A is inserted into the housing 2. FIG. 8C is a sectional view showing the cut end 145 and the projection 148 when pulling off of the gasket body 101A from the housing 2 starts and ends.

As shown in FIG. 8B, the cut end 145 and the projection 148 do not prevent an insertion of the gasket, and the out end 145 is located near the boundary between the perforation hole 4 and the bottom surface 8. In addition, the cut end 145 slightly opens to the outside. As shown in FIG. 8C, the cut end 145 is caught by the bottom surface 8 when the gasket is pulled off, making pulling off difficult.

Figure 10:
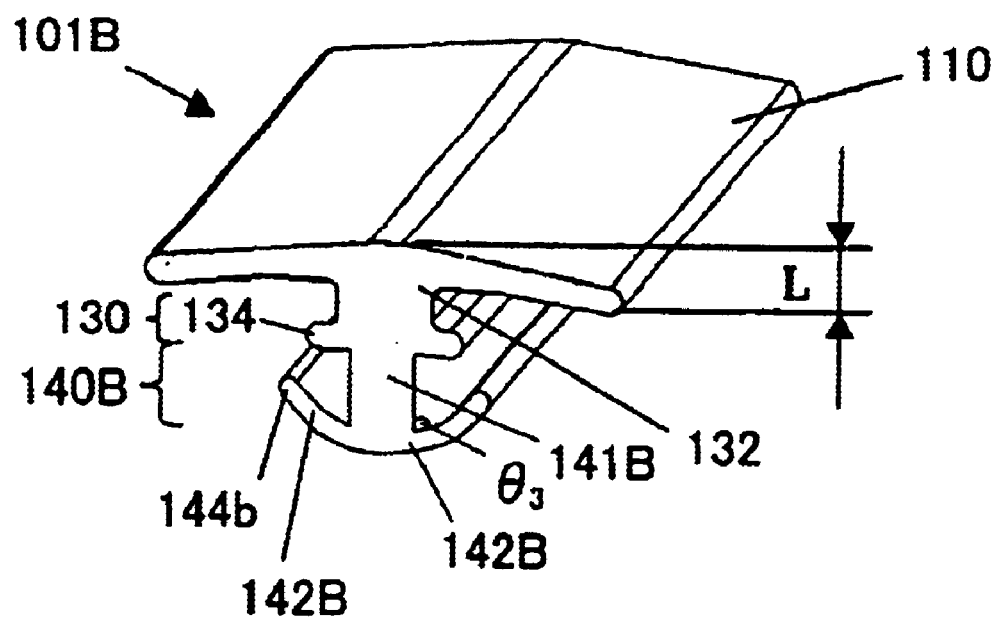
FIG. 10 is a partial sectional view showing another variation of the gasket body shown in FIG. 1.

FIG. 10 shows a gasket body 101B as another variation of the gasket body 101. The gasket body 101B has an engagement part 140B that is different in that it includes feet 142B with an anchor shape.

More specifically, the engagement part 140B includes legs 141B coupled with the support part 132, and legs 142B coupled with the legs 141B. The legs 141B of the instant embodiment is formed as a single member without diverging from the support part 130. Similar to FIG. 1, the length of the leg 141B must be set so that the foot 142B is connectable to the bottom surface 8. A width of the leg 141B is set so that it provides the foot 142B with rigidity to some extent so as to prevent the foot 142B from easily deforming in pulling off.

The tips 144b of the feet 142B must be located outside the projections 134, similar to FIG. 1. An angle $\theta_3$, at which the foot 142B extends, corresponds functionally to the angle $\theta_2$ shown in FIG. 1, and a description will be omitted. The foot 142B shown in FIG. 10 has an arc shape having a central angle of 120°, but may have a shape of an ellipse, quadratic curve, and other curves, a V-shape, and other shapes.

Figure 11:
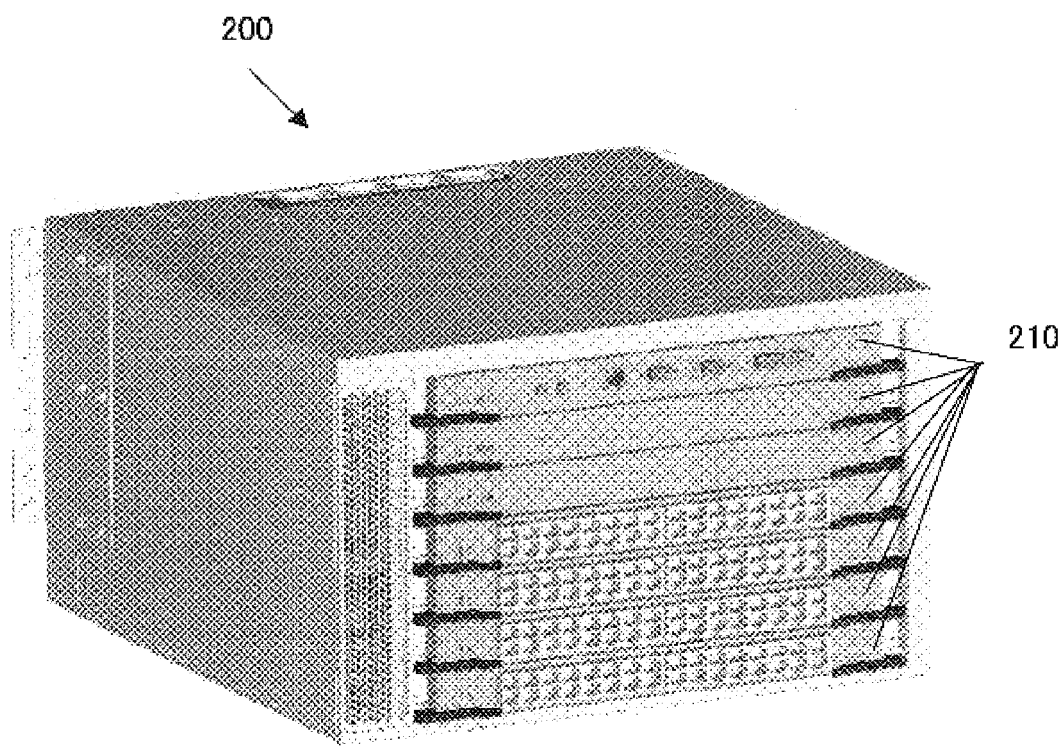
FIG. 11 is a perspective overview of a network device as one example of an inventive electronic apparatus.
Figure 12:
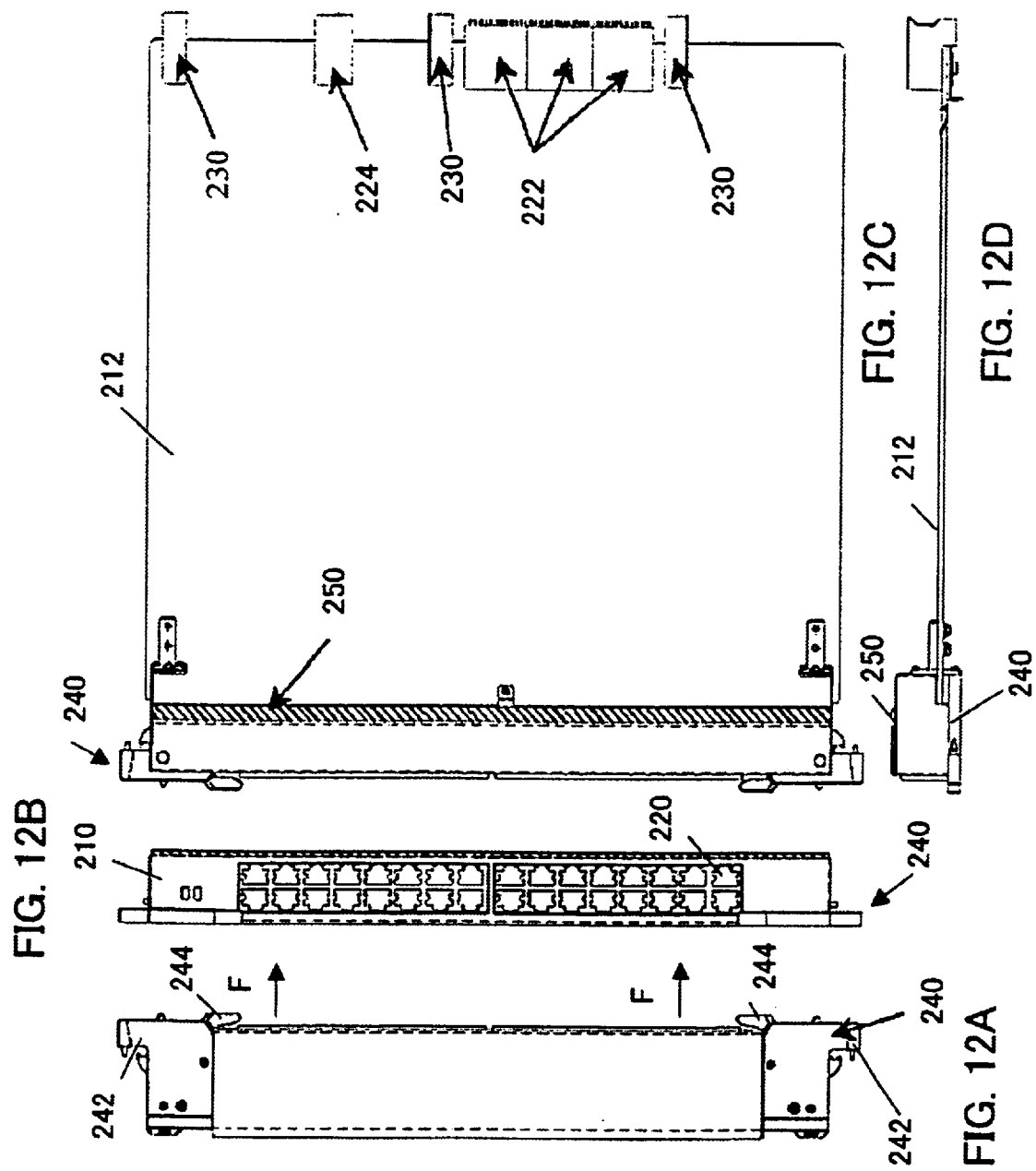
FIG. 12 is a view showing a plug in unit structure; that is removably accommodated into the electronic apparatus shown in FIG. 11.
Figure 13:
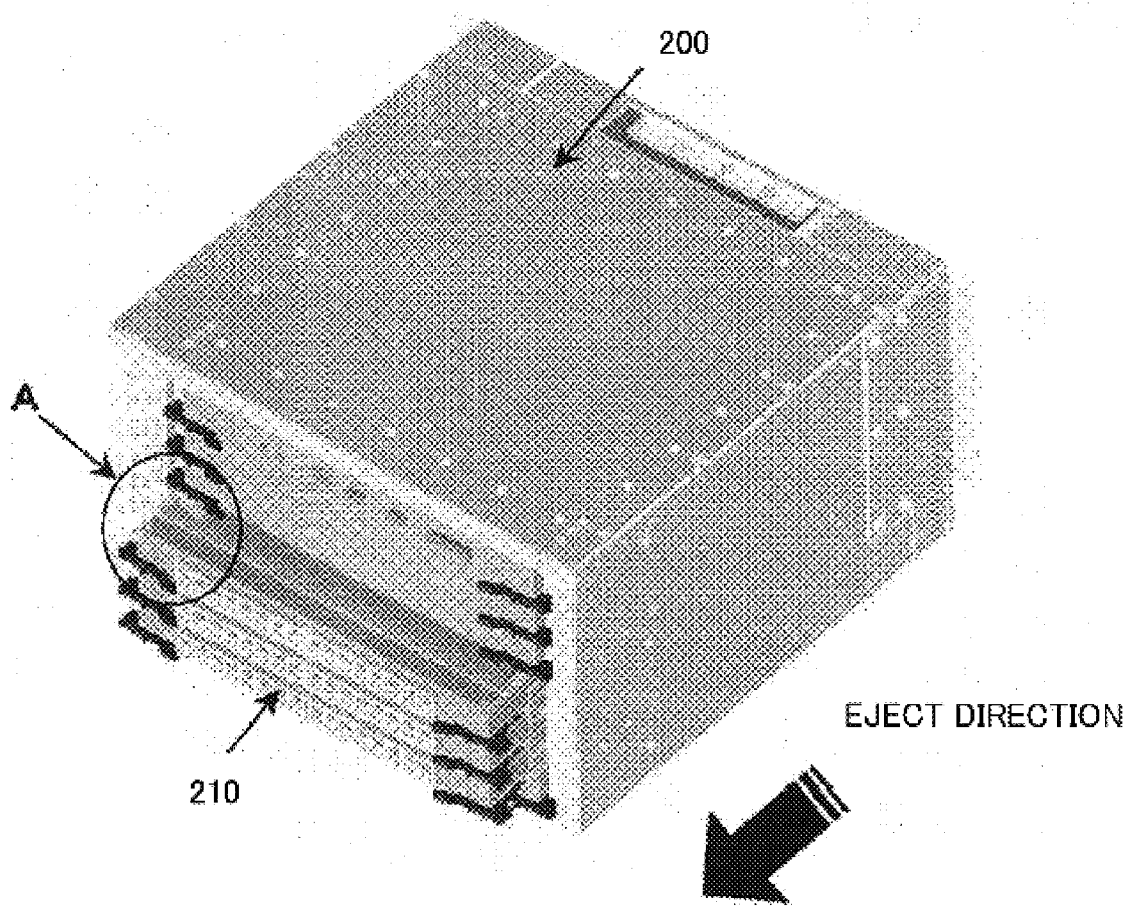
FIG. 13 is a perspective overview showing the plug in unit shown in FIG. 12 that is being removed from the network device shown in FIG. 11.

A description will now be given of a network device 200 as an inventive electronic apparatus with reference to FIGS. 11 to 15. Here, FIG. 11 is perspective overview of the network device 200. FIG. 12 is a view showing a plug in unit ("PIU") structure 210. FIG. 13 is a perspective overview showing the PIU 210 that is being removed from the network device 200.

As shown in FIG. 11, the network device 200 is a rack- or shelf-shaped communication controller that removably accommodates plural PIUs 210 of the same type or different types. In the instant embodiment, the network device 200 can accommodate seven PIUs 210, but the number is exemplary. FIG. 11 assigns the same reference numeral to different types of PIUs for convenience.

FIG. 12 is a view showing a certain type of PIU 210 that has a LAN connector 220. FIG. 12A is a bottom view of an eject mechanism 240 of the PIU 210. FIG. 12B is a front view of the PIU 210. FIG. 12C is a plane view of the PIU 210. FIG. 12D is a side view of FIG. 12C.

The PIU 210 shown in FIG. 12 accommodates a printed circuit board (not shown) in a housing 212, and includes various connectors 220 to 224, a guide module 230, and an eject mechanism 240, and a shield gasket 250.

The connector 220 is a LAN connector connected to an external terminal, and there are plural connectors in the PIU shown in FIG. 12. Each LAN connector 220 is connected to a communication terminal that communicates on the network, such as a personal computer ("PC") and a hub, for example, via a UTP cable (not shown). The connector 222 is a connector connected to the network device 200. The connector 224 serves as a connector for power supply. The guide module 230 serves to guide insertion and ejection of the PIU 210, may apply any structure known in the art, and a detailed description thereof will be omitted.

The eject mechanism 240 serves to eject the PU 210 from the network device 200, and includes a pair of L-shaped card ejectors 242, and tabs 242 provided onto them. A user pulls the tubs 244 in a direction F shown in FIG. 12A using his/her thumb, and ejects the PIU 210 from the network device 200. The eject mechanism 240 may use any structure known in the art, and a description thereof will be omitted.

The PIU 210 further includes a shield gasket 250, as shown in FIGS. 12C and 12D. The gasket 250 is provided at both sides to shields right and left sides of the PIU 210. The shield gasket 250 may apply to gasket 100, thereby preventing leakages of electromagnetic waves and noises from the printed circuit board outside the PIU 210.

Figure 14:
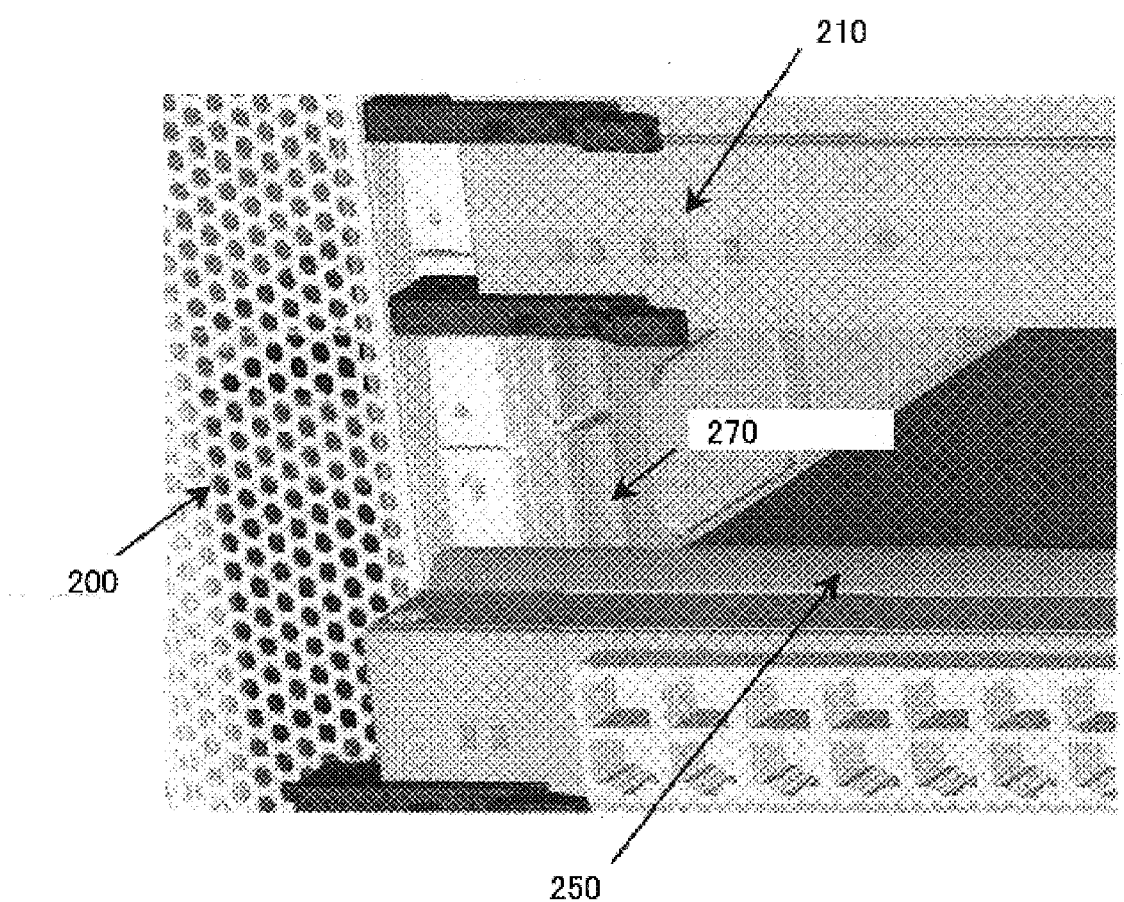
FIG. 14 is an enlarged perspective view of part A shown in FIG. 13.

FIG. 13 is a perspective overview showing the PIU 210 that is being partially removed from the network device 200. FIG. 14 is an enlarged perspective view of part A shown in FIG. 13. As shown in FIG. 14, the network device 200 includes therein a shield gasket 270. The shield gasket 270 may apply gasket 100, thereby preventing leakages of electromagnetic waves and noises from the printed circuit board (not shown) outside the network device 200.

FIG. 15A is a front view of the three-layer PIU 210 accommodated in the network device 200 shown in FIG. 11. FIG. 15B is a side view of part 260 that contains the gasket 270 shown in FIG. 13 at the side of the PIU 10. FIG. 15C is a view showing part of the upper PIU 210 in a view corresponding to FIG. 12A, which contacts the gasket 250 of the lower PIU 210, and bevel part $S_3$ indicates a contact portion.

A contact between a spring of the connector 220 and a front-plate square hole shield the connector 220 as shown in an arrow $S_1$ in FIG. 15A, nd a contact with a gasket of the next PIU 210 maintains an electromagnetic shield. As discussed above, the cotton 190 is so elastic that the gasket does not get damaged even when the upper PIU 210 contacts or moves on the conductive cloth 192.

According to the network device 200 that utilizes the inventive gaskets 250 and 270, electronic waves generated from the network device 200 and the PIU 210 can be prevented from leaking.

Further, the present invention is not limited to these preferred embodiments, and various variations and modifications may be made without departing from the spirit and scope thereof. For example, an electronic apparatus applicable to the present invention is not limited to network devices.

Thus, the present invention may provide a gasket that is structurally easily mounted onto and hard to come off from an electron apparatus, and the electronic apparatus having the gasket.

What is claimed is:

1. A gasket that serves to shield electromagnetic waves from an electronic apparatus that has a housing that includes a first surface and second surface opposite to the first surface, said gasket being squeezed into a perforation hole that perforates the first and second surfaces, and fixed onto the housing, said gasket comprising:
    a lid part that contacts the first surface and serves as a flat spring; and
    an insertion part that is to be inserted into the perforation hole in the housing,
        wherein the insertion part includes:
        a support part that extends from an approximate center of said lid part and is accommodated into the perforation hole; and
    an engagement part, coupled with the support part, which at least partially projects from the perforation hole in the housing and contacts the second surface,
        wherein the engagement part includes:
        a leg coupled with the support part; and
        a foot that is coupled with the leg and forms an acute angle relative to the leg.

2. A gasket according to claim 1, wherein the leg diverges from an approximate center of the support part.

3. A gasket according to claim 2, wherein the support part has a projection opposite to the perforation hole.

4. A gasket according to claim 1, wherein the leg extends from the support part and forms an acute angle relative to the support part.

5. A gasket that serves to shield electromagnetic waves from an electronic apparatus that has a housing that includes a first surface and a second surface opposite to the first surface, said gasket being squeezed into a perforation hole that perforates the first and second surfaces, and fixed onto the housing, said gasket comprising:
    a lid part that contacts the first surface and serves as a flat spring; and an insertion part that is to be inserted into the perforation hole in the housing, and includes an engagement part, coupled with the support part, which at least partially projects from the perforation hole in the housing and contacts the second surface, wherein the engagement part includes:

a leg coupled with the support part; and a foot that is coupled with the leg and forms an acute angle relative to the leg.

6. A gasket according to claim 5, wherein the foot has a tip that is to contact the second surface.

7. A gasket according to claim 5, wherein the engagement part has a projection that prevents said gasket from coming off and projects from the foot.

8. A gasket according to claim 5, wherein the foot has a tip that can contact the second surface, and has an acute shape in sectional that prevents coming off of said gasket.

9. A gasket according to claim 5, wherein the engagement part has an anchor shape.

10. A gasket that serves to shield electromagnetic waves from an electronic apparatus that has a housing that includes a first surface and a second surface opposite to the first surface, said gasket being squeezed into a perforation hole that perforates the first and second surfaces, and fixed onto the housing, said gasket comprising:

a lid part that contacts the first surface and serves as a flat spring; and an insertion part that is to be inserted into the perforation hole in the housing, and includes an engagement part, coupled with the support part, which at least partially projects from the perforation hole in the housing and contacts the second surface, wherein the engagement part includes a pair of projections that extend in opposite directions, which do not contact each other while said gasket is being inserted into the housing, and contact each other when said gasket is being pulled off from the housing.

11. An electronic apparatus comprising:

a housing that includes a first surface and a second surface opposite to the first surface, the housing has a perforation hole that perforates the first and second surfaces; and a gasket, squeezed into and fixed onto the housing, which serves to shield electromagnetic waves from the electronic apparatus, wherein said gasket includes:

a lid part that contacts the first surface and serves as a flat spring; and an insertion part that is to be inserted into the perforation hole in the housing, wherein the insertion part includes:

a support part that extends from an approximate center of said lid part and is accommodated into the perforation hole; and an engagement part, coupled with the support part, which at least partially projects from the perforation hole in the housing and contacts the second surface, wherein the engagement part includes:

a leg coupled with the support part; and a foot that is coupled with the leg and forms an acute angle relative to the leg.

12. An electronic apparatus comprising:

a housing that includes a first surface and a second surface opposite to the first surface, the housing has a perforation hole that perforates the first and second surfaces; and a gasket, squeezed into and fixed onto the housing, which serves to shield electromagnetic waves from the electronic apparatus, wherein said gasket includes:

a lid part that contacts the first surface and serves as a flat spring; and an insertion part that is to be inserted into the perforation hole in the housing, and includes an engagement part coupled with the support part, which at least partially projects from the perforation hole in the housing and contacts the second surface, wherein the engagement part includes:

a leg coupled with the support part; and a foot that is coupled with the leg and forms an acute angle relative to the leg.

13. An electronic apparatus comprising:

a housing that includes a first surface and a second surface opposite to the first surface, the housing has a perforation hole that perforates the first and second surfaces; and a gasket, squeezed into and fixed onto the housing, which serves to shield electromagnetic waves from the electronic apparatus, wherein said gasket includes:

a lid part that contacts the first surface and serves as a flat spring; and an insertion part that is to be inserted into the perforation hole in the housing, and includes an engagement part, coupled with the support part, which at least partially projects from the perforation hole in the housing and contacts the second surface, wherein the engagement part includes a pair of projections that extend in opposite directions, which do not contact each other while said gasket is being inserted into the housing, and contact each other while said gasket is being pulled off from the housing.

* * * * *